(12) United States Patent
Jin (10) Patent No.: US 11,588,049 B2
(45) Date of Patent: Feb. 21, 2023

(54) SEMICONDUCTOR DEVICE AND METHOD FOR MANUFACTURING SAME

(71) Applicant: CSMC TECHNOLOGIES FAB2 CO., LTD., Jiangsu (CN)

(72) Inventor: Huajun Jin, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 34 days.

(21) Appl. No.: 17/262,882

(22) PCT Filed: Jul. 26, 2019

(86) PCT No.: PCT/CN2019/097836
§ 371 (c)(1),
(2) Date: Jan. 25, 2021

(87) PCT Pub. No.: WO2020/020328
PCT Pub. Date: Jan. 30, 2020

(65) Prior Publication Data
US 2021/0234041 A1     Jul. 29, 2021

(30) Foreign Application Priority Data
Jul. 27, 2018 (CN) .......................... 201810840983.8

(51) Int. Cl.
*H01L 29/78* (2006.01)
*H01L 29/06* (2006.01)
(Continued)

(52) U.S. Cl.
CPC ...... *H01L 29/7816* (2013.01); *H01L 29/0653* (2013.01); *H01L 29/407* (2013.01); *H01L 29/66681* (2013.01)

(58) Field of Classification Search
CPC ............. H01L 29/7816; H01L 29/0653; H01L 29/407; H01L 29/66681; H01L 29/402;
(Continued)

(56) References Cited

U.S. PATENT DOCUMENTS 7,956,412 B2   6/2011   Feilchenfeld et al.
8,981,475 B2   3/2015   Sharma et al.
(Continued)

FOREIGN PATENT DOCUMENTS

CN    104538309    4/2015
JP    H07135249    5/1995
(Continued)

OTHER PUBLICATIONS

China Office Action for 201810840983.8 dated Aug. 27, 2020, 9 pages.
(Continued)

*Primary Examiner* — Galina G Yushina
(74) *Attorney, Agent, or Firm* — Dority & Manning, P.A.

(57) ABSTRACT

A semiconductor device and method for manufacturing same. The semiconductor device comprises: a drift region (120); an isolation structure (130) contacting the drift region (120), the isolation structure (130) comprising a first isolation layer (132), a hole etch stop layer (134) on the first isolation layer (132), and a second isolation layer (136) on the hole etch stop layer (134); and a hole field plate (180) provided above the hole etch stop layer (134) and contacting the hole etch stop layer (134).

12 Claims, 5 Drawing Sheets

(51) Int. Cl.
*H01L 29/40* (2006.01)
*H01L 29/66* (2006.01)

(58) Field of Classification Search
CPC .......... H01L 29/66659; H01L 29/7835; H01L 29/0646; H01L 29/7846
See application file for complete search history.

(56) References Cited

U.S. PATENT DOCUMENTS

| | | |
|---|---|---|
| 9,852,993 B2 | 12/2017 | Park |
| 2002/0079521 A1* | 6/2002 | Lin ................ H01L 29/404 257/E29.256 |
| 2005/0170606 A1* | 8/2005 | Fu ................... A61F 2/958 438/424 |
| 2009/0078998 A1* | 3/2009 | Shi ............... H01L 29/78654 257/E21.24 |
| 2010/0140715 A1 | 6/2010 | Nakamura et al. |
| 2011/0115018 A1* | 5/2011 | McGregor ........ H01L 29/0653 257/341 |
| 2016/0111488 A1* | 4/2016 | Lu ................. H01L 21/76229 438/270 |
| 2016/0351704 A1* | 12/2016 | Duan ............. H01L 29/66659 |
| 2017/0084739 A1* | 3/2017 | Hsiao ............. H01L 29/7816 |
| 2017/0104097 A1* | 4/2017 | Park .............. H01L 29/0653 |
| 2017/0117369 A1* | 4/2017 | Trautmann ........ H01L 29/1095 |
| 2017/0250277 A1* | 8/2017 | Wu ................ H01L 29/7835 |
| 2021/0296451 A1* | 9/2021 | Chen ............. H01L 21/31053 |

FOREIGN PATENT DOCUMENTS

| | | |
|---|---|---|
| JP | 2003332424 | 11/2003 |
| JP | 2005303253 | 10/2005 |
| JP | 2011171638 | 9/2011 |
| JP | 2015162581 | 9/2015 |
| JP | 2017028116 | 2/2017 |
| WO | WO2010013683 | 2/2010 |

OTHER PUBLICATIONS

International Search Report for PCT/CN2019/097836 dated Oct. 22, 2019, 4 pages.

Extended European Search Report for corresponding EP Application No. 19841203.3, dated Mar. 21, 2022, 38 pages.

Japanese Office Action (w/ English translation) for corresponding Japanese Application No. 2021-504447, dated Apr. 5, 2022, 8 pages.

Korean Office Action (w/ English translation) for corresponding Korean Application No. 10-2021-7005241, dated Apr. 25, 2022, 8 pages.

* cited by examiner

SEMICONDUCTOR DEVICE AND METHOD FOR MANUFACTURING SAME

TECHNICAL FIELD

The present application relates to a field of semiconductor manufacturing, in particular, to a semiconductor device, and further to a method for manufacturing the semiconductor device.

BACKGROUND

For semiconductor devices that require higher Breakdown Voltage (BV), such as power devices, a field plate structure can be used to increase their breakdown voltage. By further improving the structure and manufacturing process of the field plate, a better effect of increasing the breakdown voltage can be obtained.

SUMMARY

Accordingly, it is necessary to provide a semiconductor device and a method for manufacturing the same.

A semiconductor device includes: a drift region; an isolation structure in contact with the drift region, which includes a first isolation layer, a hole etch stop layer formed on the first isolation layer, and a second isolation layer formed on the hole etch stop layer; and a hole field plate disposed above the hole etch stop layer and in contact with the hole etch stop layer.

A method for manufacturing a semiconductor device includes: forming a trench on a surface of a substrate; forming a first isolation layer on an inner surface of the trench; forming a hole etch stop layer on the first isolation layer; forming a second isolation layer at a remaining region in the trench; forming a drift region, wherein the drift region is in contact with an isolation structure, and the isolation structure includes the first isolation layer, the hole etch stop layer, and the second isolation layer; forming a field plate hole by etching, the field plate hole extending through the second isolation layer to the hole etch stop layer; and filling a material into the field plate hole to form a hole field plate.

The above semiconductor device and the method for manufacturing the semiconductor device are formed with the hole field plate connected to the isolation structure, which can help to deplete the drift region, thereby effectively improving the breakdown voltage of the device. The hole etch stop layer is formed in the isolation structure, such that a position of the hole etch stop layer to which the hole field plate extends downward can be accurately controlled, and the thickness of the isolation structure below the hole field plate can be controlled to be the thickness of the first isolation layer, thereby ensuring that the effect of the hole field plate helping to deplete the drift region will not deviate from an expectation due to the hole field plate being too deep or too shallow. Therefore, the stability and uniformity of the device can be ensured.

DETAILED DESCRIPTION OF THE EMBODIMENTS

In order to facilitate the understanding of the present disclosure, the present disclosure will be described more fully below with reference to relevant attached drawings. Preferred embodiments of the present disclosure are illustrated in the drawings. However, the present disclosure can be implemented in many different forms and is not limited to the embodiments described herein. On the contrary, providing these embodiments is to assist understanding the content disclosed by the present disclosure more fully and thoroughly.

Unless otherwise defined, all technical and scientific terms used herein have the same meaning as commonly understood by those skilled in the technical field of the present disclosure. The terms used in the specification of the present disclosure herein are only for the purpose of describing specific embodiments, and are not intended to limit the present disclosure. The term "and/or" as used herein includes any and all combinations of one or more related listed items.

Terms related to a semiconductor field used herein are technical terms commonly used by those skilled in the art. For example, for P type and N type impurities, in order to distinguish a doping concentration, a P+ type simply represents a P type with heavy doping concentration, a P type represents a P type with medium doping concentration, a P− type represents a P type with light doping concentration, a N+ type represents a N type with heavy doping concentration, a N type represents a N type with medium doping concentration, and a N− type represents a N type with light doping concentration.

Figure 1:
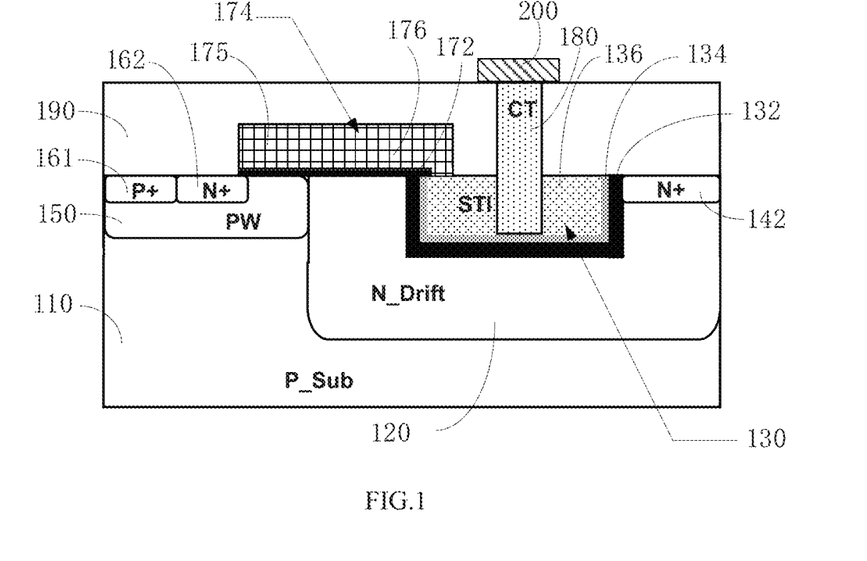
FIG. 1 is a cross-sectional structural schematic view of a semiconductor device according to an embodiment.

FIG. 1 is a cross-sectional structural schematic view of a semiconductor device according to an embodiment. The semiconductor device includes a drift region 120, an isolation structure 130, and a hole field plate 180. The isolation structure 130 is in contact with the drift region 120. The isolation structure 130 includes a first isolation layer 132, a hole etch stop layer 134 formed on the first isolation layer 132, and a second isolation layer 136 formed on the hole etch stop layer 134. The hole field plate 180 is disposed above the hole etch stop layer 134 and is in contact with the hole etch stop layer 134. In the embodiment shown in FIG. 1, the drift region 120 surrounds the isolation structure 130 in a cross section, and the hole field plate 180 extends downward to the hole etch stop layer 134.

The aforementioned semiconductor device has the hole field plate 180 connected to the isolation structure 130. Since the isolation structure 130 is in contact with the drift region 120, the hole field plate 180 can help to deplete the drift region 120, thereby effectively improving the breakdown voltage of the device. The hole etch stop layer 134 is formed in the isolation structure 130, such that the hole field plate 180 can be accurately controlled to extend downward to a position of the hole etch stop layer 134, and a thickness of the isolation structure 130 below the hole field plate 180 can be controlled to be a thickness of the first isolation layer 132, thereby ensuring that the effect of the hole field plate 180 helping to deplete the drift region 120 will not deviate from an expectation due to the hole field plate 180 being too deep or too shallow (that is, the depth of the holes deviating from a design value). Therefore, the stability and uniformity of the device can be guaranteed.

The isolation structure 130 adds the hole etch stop layer 134 made of another material inside the conventional isolation structure. That is, inside the isolation structure made of an insulating material A, the hole etch stop layer made of a material B is added. It is necessary that there is a higher etching selectivity between the material B and the insulating material A, such that when forming (holes of) the hole field plate 180 by etching, the etching will stop at the hole etch stop layer 134 after etching through the second isolation layer 136.

In order to prevent the hole etch stop layer 134 from affecting the performance of the isolation structure 130 itself, the hole etch stop layer 134 should be made relatively thin. Of course, the premise is to ensure that when the hole field plate 180 is formed by etching, the etching will not etch through the hole etch stop layer 134 within a reasonable etching time.

In one embodiment, the isolation structure 130 is a shallow trench isolation structure (STI). The first isolation layer 132 and the second isolation layer 136 are made of silicon oxide, such as silicon dioxide.

In one embodiment, the hole etch stop layer 134 is made of a nitrogen-containing compound, such as silicon nitride.

In one embodiment, the hole field plate 180 is made of an insulating material. That is, the material filled in the holes is an insulating material.

In one embodiment, the semiconductor device further includes a metal layer 200. A top portion of the hole field plate 180 is connected to the metal layer 200. In one embodiment, the semiconductor device further includes an interlayer dielectric (ILD) 190 disposed between the isolation structure 130 and the metal layer 200. The hole field plate 180 extends through the interlayer dielectric 190 to connect the metal layer 200 and the isolation structure 130.

The interlayer dielectric 190 may be made of a material used as an interlayer dielectric known in the art, such as phosphosilicate glass (PSG), or borophosphosilicate glass (BPSG).

In one embodiment, the semiconductor device further includes a polysilicon structure 174. The polysilicon structure 174 includes a polysilicon gate 175 located on a gate oxide layer 172 and a polysilicon field plate 176 extending to the isolation structure 130.

In one embodiment, the semiconductor device is a lateral diffusion metal oxide semiconductor field effect transistor (LDMOSFET).

In the embodiment shown in FIG. 1, the semiconductor device includes a drain region 142 and a source region 162. The polysilicon gate is located above a region between the drain region 142 and the source region 162. The drain region 142 is located in the drift region 120, and the drain region 142 is located at a side of the isolation structure 130 opposite to the polysilicon gate (in FIG. 1, the drain region 142 is located on the right side of the isolation structure 130, and the polysilicon gate is located on the left side of the isolation structure 130).

In the embodiment shown in FIG. 1, the drift region 120 of a first conductivity type is located in a substrate 110 of a second conductivity type. The semiconductor device further includes a well region 150 of the second conductivity type formed in the substrate 110. A side of the polysilicon gate opposite to the isolation structure 130 extends onto the well region 150 of the second conductive type.

In the embodiment shown in FIG. 1, the semiconductor device further includes a doped region 164 of the second conductivity type located in the well region 150 of the second conductivity type. The doped region 164 of the second conductivity type is located at a side of the source region 162 away from the polysilicon gate.

In the embodiment shown in FIG. 1, the holes of the hole field plate 180 are contact holes (CT).

In one embodiment, the first conductivity type is the N type and the second conductivity type is the P type. In the embodiment shown in FIG. 1, the substrate 110 is a P type substrate (P_Sub), the drift region 120 is an N type drift region (N_Drift). The well region 150 of the second conductivity type is a P well (PW). The drain region 142 is an N+ drain region. The source region 162 is an N+ source region. The doped region 164 of the second conductivity type is a P+ region.

In other embodiments, the first conductivity type may be a P type, and the second conductivity type may be an N type.

Figure 2:
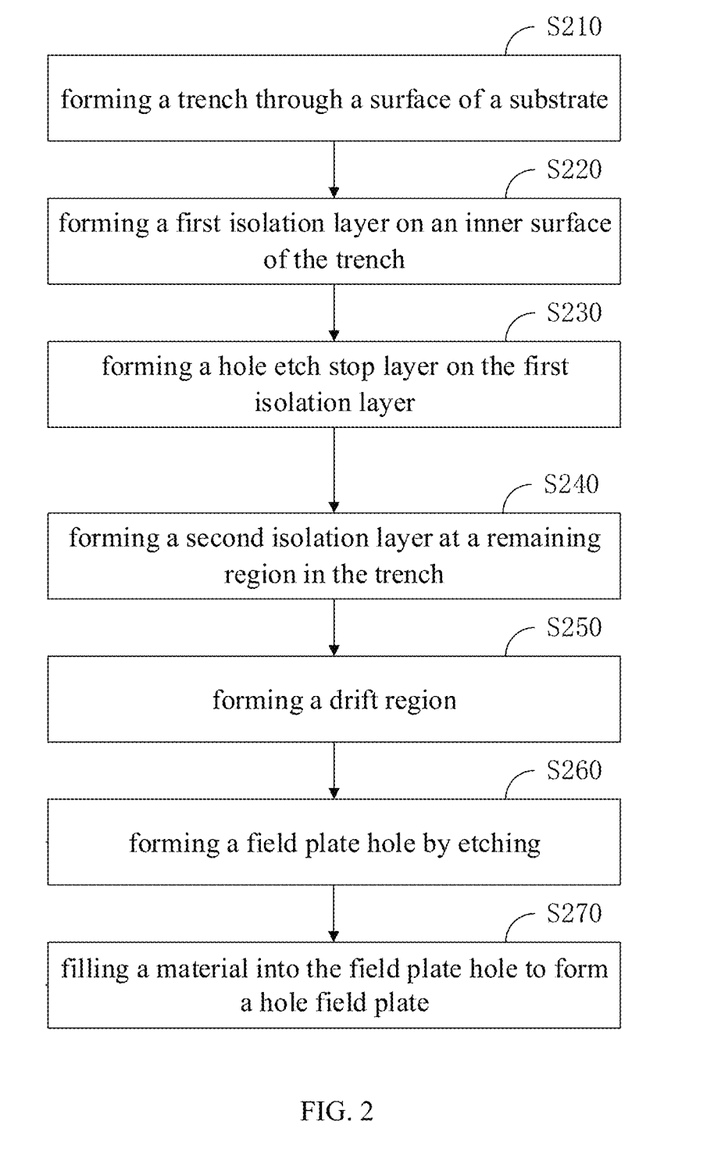
FIG. 2 is a flowchart of a method for manufacturing a semiconductor device according to an embodiment.

The present application also provides a method for manufacturing a semiconductor device, which can be used to manufacture the semiconductor device of any of the above embodiments. FIG. 2 is a flowchart of a method for manufacturing a semiconductor device in an embodiment. The method includes the following steps.

S210, a trench is formed through a surface of a substrate.

The trench is formed to form an isolation structure in the trench. In one embodiment, the trench may be formed by an etching process.

Figure 3A:
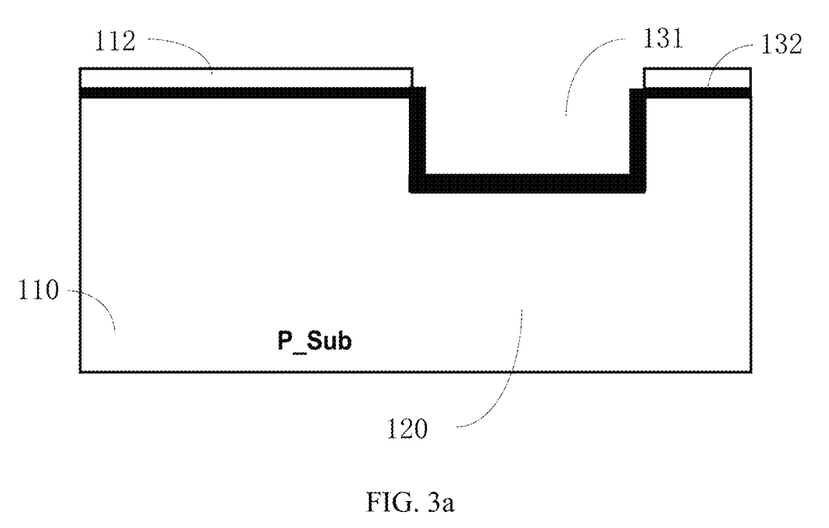
FIGS. 3a to 3f are cross-sectional structural schematic views of a semiconductor device during a manufacturing process by the method shown in FIG. 2.

Referring to FIG. 3a, in one embodiment, a hard mask 112 is used as a mask to etch a trench 131. For example, using silicon nitride as the hard mask 112, an etching window where the trench 131 is to be formed is exposed by photolithography, and then the silicon nitride at the etching window is etched away, and the trench 131 is formed by etching downward.

S220, a first isolation layer is formed on an inner surface of the trench.

Referring to FIG. 3a, in this embodiment, a first isolation layer 132 is made of silicon oxide, such as silicon dioxide. In the embodiment shown in FIG. 3a, this step includes growing a layer of oxide on the substrate 110 by thermal oxidation. In the embodiment shown in FIG. 3a, the first isolation layer 132 is also grown below the hard mask 112.

S230, a hole etch stop layer is formed on the first isolation layer.

Figure 3B:
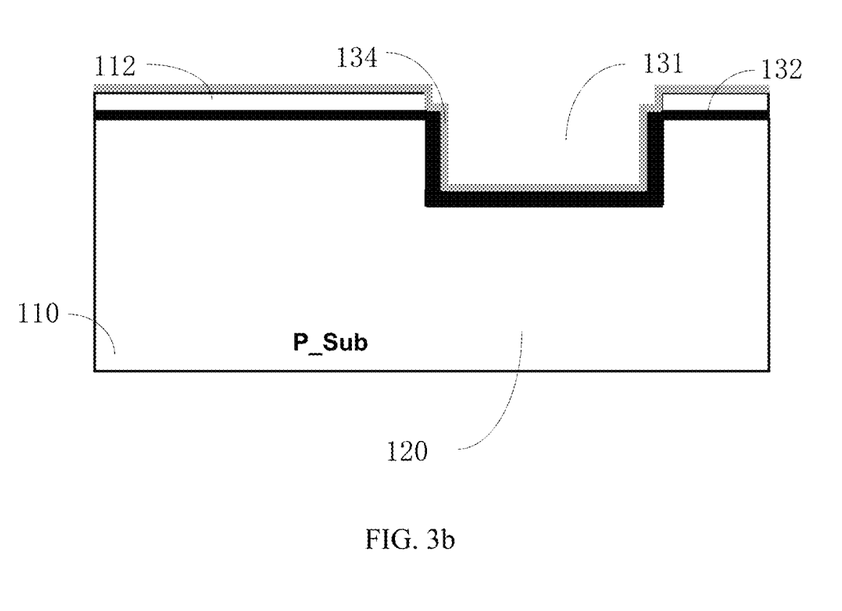

Referring to FIG. 3b, in one embodiment, a hole etch stop layer 134 is formed by a deposition process. For ease of operation, the deposited hole etch stop layer 134 in the embodiment shown in FIG. 3b is also formed on the hard mask 112.

S240, a second isolation layer is forming at a remaining region in the trench.

Figure 3C:
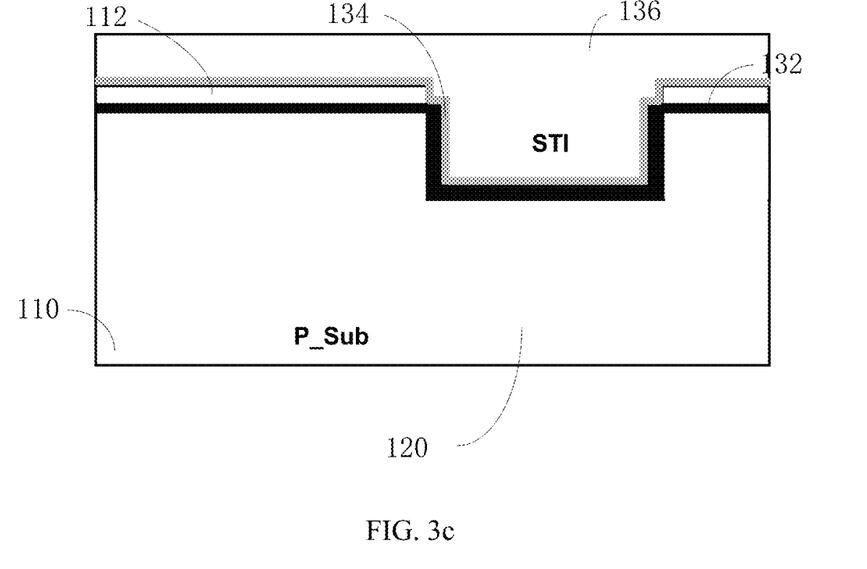

In order to ensure that the trench is fully filled, in the embodiment shown in FIG. 3c, a second isolation layer 136 is over-deposited. That is, the thickness of the deposited second isolation layer 136 is greater than the thickness required to fill the trench. The formed second isolation layer 136 covers the hole etch stop layer 134 in the trench and the hole etch stop layer 134 outside the trench. The first isolation layer 132, the hole etch stop layer 134 and the second isolation layer 136 cooperatively form an isolation structure.

Figure 3D:
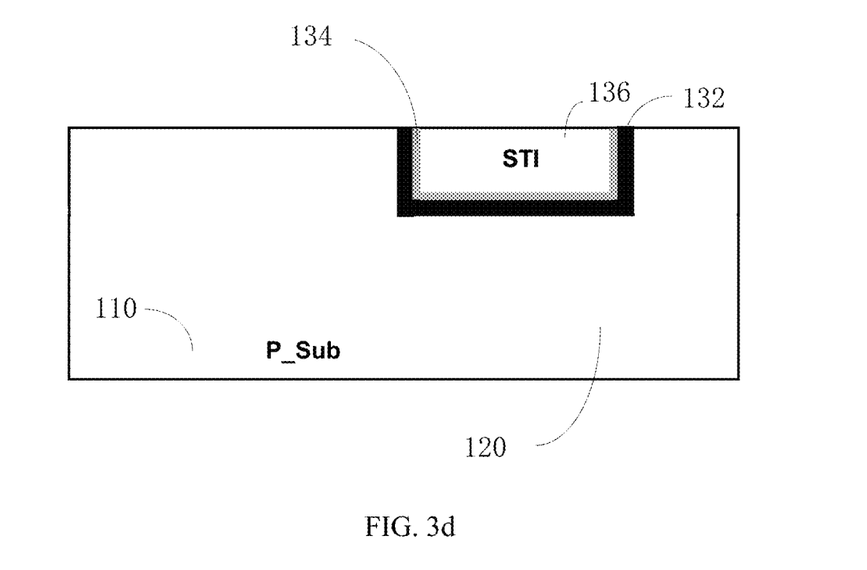

In the embodiment shown in FIG. 3d, after step S240 is completed, the surface of the substrate is planarized. For example, a portion of the first isolation layer 132 is removed using chemical mechanical polishing (CMiP). Then, the hard mask 112, the second isolation layer 136, the hole etch stop layer 134, and the first isolation layer 132 on the substrate 110 are peeled off (by an etching process, without etching away the isolation structure in the trench). Finally, a structure shown in FIG. 3d is obtained.

S250, a drift region is formed.

The drift region is in contact with the isolation structure. In this embodiment, the drift region is formed after the isolation structure is formed (that is, after the first isolation layer 132, the hole etch stop layer 134, and the second isolation layer 136 are formed). In other embodiments, the drift region may also be firstly formed, and then the isolation structure is formed.

S260, a field plate hole is formed by etching.

Figure 3E:
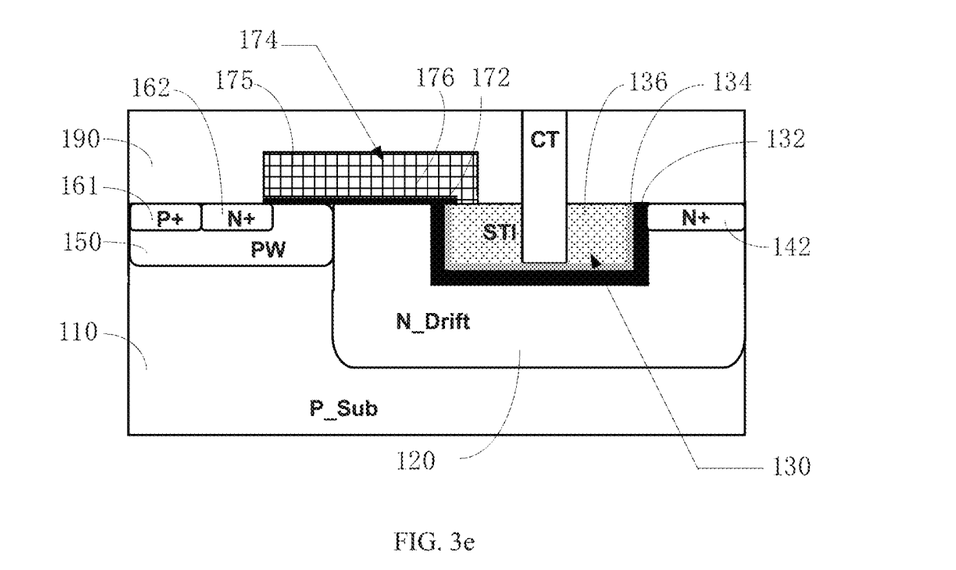

When etching the field plate hole, depths of the holes are controlled by the hole etch stop layer 134. Therefore, it is necessary that there is a higher etching selectivity between a material forming the hole etch stop layer 134 and a material forming the second isolation layer 136, such that the etching will stop at the hole etch stop layer 134 after etching through the second isolation layer 136, as shown in FIG. 3e. In one embodiment, the second isolation layer 136 is made of silicon oxide, such as silicon dioxide. The hole etch stop layer 134 is made of a nitrogen-containing compound, such as silicon nitride.

S270, a material is filled into the field plate hole to form a hole field plate.

The above semiconductor device is formed with the hole field plate connected to the isolation structure. Since the isolation structure is in contact with the drift region, the hole field plate can help to deplete the drift region, thereby effectively improving the breakdown voltage of the device. The hole etch stop layer 134 is formed in the isolation structure, such that a position to which the hole field plate extends downward can be accurately controlled, and the thickness of the isolation structure below the hole field plate can be controlled to be the thickness of the first isolation layer 132, thereby ensuring that the effect of the hole field plate helping to deplete the drift region will not deviate from an expectation due to the hole field plate being too deep or too shallow (that is, the depth of the hole deviating from a design value). Therefore, the stability and uniformity of the device can be guaranteed.

Since the depletion effect of the hole field plate to the drift region is related to the thickness of the isolation structure below the hole field plate, the required thickness of the first isolation layer 132 can be pre-calculated according to the required breakdown voltage of the device (or the required thickness of the first isolation layer 132 is pre-calculated by other means). In step S220, silicon oxide is grown according to the thickness. In addition, the hole etch stop layer 134 formed in step S230 is used to separate the first isolation layer 132 from the second isolation layer 136, such that the required thickness of the first isolation layer 132 can be predetermined, thus further effectively controlling the thickness of the first isolation layer 132.

In one embodiment, the semiconductor device is a lateral diffusion metal oxide semiconductor field effect transistor (LDMOSFET).

In one embodiment, after step S240, processes such as well implantation, gate oxidation, polysilicon deposition, source/drain implantation are further included. It should be understood that these steps can be performed by methods known in the art.

Figure 3F:
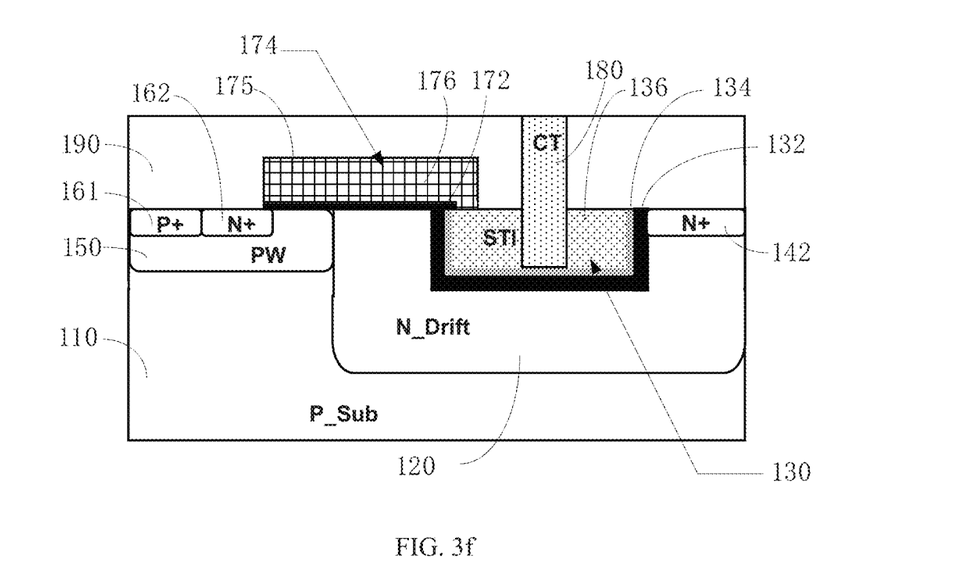

In one embodiment, a step of forming an interlayer dielectric on the isolation structure is further included. Referring to FIG. 3f, in step S260, after etching through the interlayer dielectric, continue to etch the second isolation layer 136 downward to the hole etch stop layer 134. In one embodiment, after forming the interlayer dielectric on the isolation structure, a step of forming a metal layer 200 on the interlayer dielectric is further included. The top portion of the hole field plate is connected to the metal layer 200.

The interlayer dielectric may be made of a material used as an interlayer dielectric known in the art, such as phosphosilicate glass (PSG), or borophosphosilicate glass (BPSG).

In order to prevent the hole etch stop layer 134 from affecting the performance of the isolation structure itself, the hole etch stop layer 134 should be made relatively thin in step S230. Of course, the premise is to ensure that when the etching time in step S230 is within a reasonable range, the hole etch stop layer 134 will not be etched through.

Only several implementations of the present disclosure are illustrated in the aforementioned embodiments, and the description thereof is relatively specific and detailed, but it should not be understood as a limitation on the scope of the present disclosure. It should be noted that for those of ordinary skill in the art, without departing from the concept of the present disclosure, several modifications and improvements can be made, which all fall within the protection scope of the present disclosure. Therefore, the protection scope of the present disclosure shall be subject to the appended claims.

What is claimed is:

1. A semiconductor device, comprising:
   a drift region;
   an isolation structure in contact with the drift region, the isolation structure comprising a first isolation layer, a hole etch stop layer formed on the first isolation layer, and a second isolation layer formed on the hole etch stop layer;
   a hole field plate disposed above the hole etch stop layer and in contact with the hole etch stop layer;
   a metal layer, wherein a top portion of the hole field plate is connected to the metal layer; and
   a polysilicon structure comprising a polysilicon gate located on a gate oxide layer and a polysilicon field plate extending to the isolation structure;
   wherein the hole field plate is not electrically connected to the polysilicon structure, and a thickness of the first isolation layer is calculated according to a required breakdown voltage of the semiconductor device.

2. The semiconductor device according to claim 1, wherein the isolation structure is a shallow trench isolation structure, the first isolation layer and the second isolation layer are made of silicon oxide.

3. The semiconductor device according to claim 2, wherein the hole etch stop layer is made of a nitrogen-containing compound.

4. The semiconductor device according to claim 1, further comprising an interlayer dielectric disposed between the isolation structure and the metal layer, wherein the hole field plate extends through the interlayer dielectric to connect the metal layer and the isolation structure.

5. The semiconductor device according to claim 1, wherein the semiconductor device is a lateral diffusion metal oxide semiconductor field effect transistor.

6. The semiconductor device according to claim 5, further comprising a drain region and a source region, wherein the polysilicon gate is located above a region between the drain region and the source region, the drain region is located in the drift region, and the drain region is located at a side of the isolation structure opposite to the polysilicon gate.

7. The semiconductor device according to claim 6, further comprising a substrate of a second conductivity type and a well region of the second conductivity type formed in the substrate, wherein a side of the polysilicon gate opposite to the isolation structure extends onto the well region of the second conductive type, the drift region is of a first conductivity type, and the drift region is located in the substrate.

8. The semiconductor device according to claim 7, further comprising a doped region of the second conductivity type located in the well region of the second conductivity type, the doped region of the second conductivity type being located at a side of the source region away from the polysilicon gate.

9. The semiconductor device according to claim 7, wherein the first conductivity type is a N type, and the second conductivity type is a P type.

10. A method for manufacturing a semiconductor device, comprising:
forming a trench through a surface of a substrate;
forming a first isolation layer on an inner surface of the trench;
forming a hole etch stop layer on the first isolation layer;
forming a second isolation layer at a remaining region in the trench;
forming a drift region, wherein the drift region is in contact with an isolation structure, and the isolation structure comprises the first isolation layer, the hole etch stop layer, and the second isolation layer;
forming a field plate hole by etching, the field plate hole extending through the second isolation layer to the hole etch stop layer;
filling a material into the field plate hole to form a hole field plate;
forming a metal layer, wherein a top portion of the hole field plate is connected to the metal layer; and
depositing polysilicon to form a polysilicon structure comprising a polysilicon gate located on a gate oxide layer and a polysilicon field plate extending to the isolation structure;
wherein the hole field plate is not electrically connected to the polysilicon structure, and a thickness of the first isolation layer is calculated according to a required breakdown voltage of the semiconductor device.

11. The method according to claim 10, further comprising a step of forming an interlayer dielectric on the isolation structure, wherein the step of forming the field plate hole by etching comprises: after etching through the interlayer dielectric, continuing to etch the second isolation layer downward to the hole etch stop layer.

12. The method according to claim 10, wherein the step of forming the first isolation layer on the inner surface of the trench comprises: thermally growing a silicon oxide.

* * * * *